(12) United States Patent
Mallinson

(10) Patent No.: US 6,677,874 B1
(45) Date of Patent: Jan. 13, 2004

(54) ANALOG-TO-DIGITAL CONVERTER

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/351,267

(22) Filed: Jan. 23, 2003

(51) Int. Cl.$^7$ .............................. H03M 1/00; H03M 1/36
(52) U.S. Cl. ....................................... 341/136; 341/159
(58) Field of Search ................................. 341/136, 159, 341/133, 163, 154, 160; 315/371

(56) References Cited

U.S. PATENT DOCUMENTS

| | | | | |
|---|---|---|---|---|
| 4,596,976 A | * | 6/1986 | Mangelsdorf et al. ...... | 341/133 |
| 4,965,495 A | * | 10/1990 | Wilber et al. ................ | 315/371 |
| 5,017,920 A | * | 5/1991 | French ........................ | 341/163 |
| 5,291,198 A | * | 3/1994 | Dingwall et al. ........... | 341/159 |
| 5,877,720 A | * | 3/1999 | Setty et al. .................. | 341/159 |

* cited by examiner

Primary Examiner—Patrick Wamsley
(74) Attorney, Agent, or Firm—Steven Law Group

(57) ABSTRACT

An analog-to-digital converter in which each of a plurality of comparators is, in a successive approximation manner, selectively enabled or disabled and the outputs from those comparators summed together to produce a digital signal therefrom. By weighting and mixing outputs of adjacent comparators in proportions calculated to provide an interpolated output of a virtual comparator between the actual comparators, many such virtual comparators can be created without the need for additional fixed hardware elements in the converter. By doing so, the converter is able to produce a digital output having n bits using only N actual hardware elements for comparing signals, where $N<2^n-1$. Each of the plurality of comparators in the converter has an input for an enabling signal, which enabling signal can be manipulated to enable or disable individual comparators and to modify their outputs. A method for converting an analog input signal into a digital signal using such a converter.

6 Claims, 5 Drawing Sheets ically in time. Each individual collection of bits is compiled with the other collected bits to characterize the input signal to a desired accuracy or resolution determined by the analog-to-digital converter. Typically, a successive approximation converter uses a single comparator to derive a single bit of information at a time on each clock cycle. In operation, during each clock cycle, a single comparator compares the input signal to a single reference signal and provides one bit of information. That reference signal is then adjusted based on this one bit. On the second clock cycle, an additional bit is derived using the adjusted reference signal. This process is repeated for a predetermined number of clock cycles sufficient to provide the number of bits required for a digital output of a desired resolution and accuracy. The collected bits are then assembled at the end of the process to deliver a digital output with the desired resolution and accuracy of the converter.

ANALOG-TO-DIGITAL CONVERTER

BACKGROUND

This invention relates to analog-to-digital converters, and more particularly, to an analog-to-digital converter configured with virtual comparators to produce an increased number of output bits with relatively low hardware requirements.

Analog-to-digital converters are well known in the art. One type of analog-to-digital converter is a "successive approximation" converter. A successive approximation converter is configured to collect bits of information pertaining to the level of the input analog signal successively in time. Each individual collection of bits is compiled with the other collected bits to characterize the input signal to a desired accuracy or resolution determined by the analog-to-digital converter. Typically, a successive approximation converter uses a single comparator to derive a single bit of information at a time on each clock cycle. In operation, during each clock cycle, a single comparator compares the input signal to a single reference signal and provides one bit of information. That reference signal is then adjusted based on this one bit. On the second clock cycle, an additional bit is derived using the adjusted reference signal. This process is repeated for a predetermined number of clock cycles sufficient to provide the number of bits required for a digital output of a desired resolution and accuracy. The collected bits are then assembled at the end of the process to deliver a digital output with the desired resolution and accuracy of the converter.

Attempts have been made to create an effective analog-to-digital converter that can produce a digital output having n bits using less than $2^n-1$ comparators to do so. In one conventional example, an analog-to-digital converter purports to use less than $2^n-1$ comparators by employing a plurality of "pseudo-comparators". These pseudo-comparators are placed between each pair of distantly-spaced actual comparators in order to generate interstitial outputs. These outputs are tailored to simulate the output of an actual comparator in that position based on weighted averages of the comparator outputs. Although such a circuit decreases the number of "primary" comparators on the input reference nodes, these pseudo-comparators are still actual discrete "hard-ware" elements in the converter circuitry. These elements exist at all times in fixed, predetermined and interpolative intervals, even though they are not actually connected to the input reference nodes. Thus, there is no real reduction in circuit elements. Another problem is that predetermined pseudo-comparator hardware elements are not variable, making them inflexible.

Therefore, there exists a need for a device and method for simultaneously collecting multiple bits of data but with relatively fewer circuit elements. As will be seen, the invention accomplishes this in an elegant manner.

SUMMARY OF INVENTION

The invention provides an analog-to-digital converter and related method where a plurality of comparators is arranged in a successive approximation manner. In operation, the converter is configured to selectively enable or disable the outputs from the individual comparators and sum the outputs together to produce a digital signal output. Furthermore, interpolated outputs may be derived by weighting and mixing outputs of adjacent comparators in proportions calculated to provide an interpolated output of a virtual comparator between actual comparators. Accordingly, many such virtual comparators can be created without the need for additional fixed hardware elements in the converter. By doing so, the converter is able to produce a digital output having a relatively larger number of bits using relatively few actual hardware elements for comparing signals.

Each of the plurality of comparators in the converter has additional inputs for a reference signal and/or an analog input signal. Each comparator further includes an input for an enablement signal and is configured to enable and disable the operation of a comparator in response to such a signal. Each comparator also includes components that produce a linear output in proportion to the enablement signal. Thus, according to the invention, a comparator output can be modified over a range by modifying the enablement signal by the desired proportions.

The invention also provides a method for converting an analog input signal into a digital signal in a successive approximation method to selectively enable or disable individual comparators over an input range and to sum the outputs of the comparators together. Virtual comparators can be created simply by varying the enabling signal to enable and disable comparators to varying degrees. Accordingly, the outputs of adjacent comparators together may be weighted and mixed together in proportions. This gives rise to virtual comparators created by operation of an interstitial output between the outputs of the actual comparators.

DETAILED DESCRIPTION

An analog-to-digital converter according to the invention is operated in a successive approximation manner. Unlike conventional successive approximation analog-to-digital converters, a converter configured according to the invention includes a plurality of comparators rather than just one. According to the invention, the converter uses many comparators, although only a small number of those comparators will be enabled at any given time. Furthermore, any two comparator outputs may be interpolated to produce digital data information from a signal range that may fall between the two comparators. Thus, a virtual comparator is created. The invention is described below in the context of a successive approximation comparator for use in converting analog signals to digital output. It will be appreciated by those skilled in the art, however, that other useful applications of the invention may be implemented without departing from the spirit and scope of the invention, where the scope is defined in the appended claims.

Figure 1:
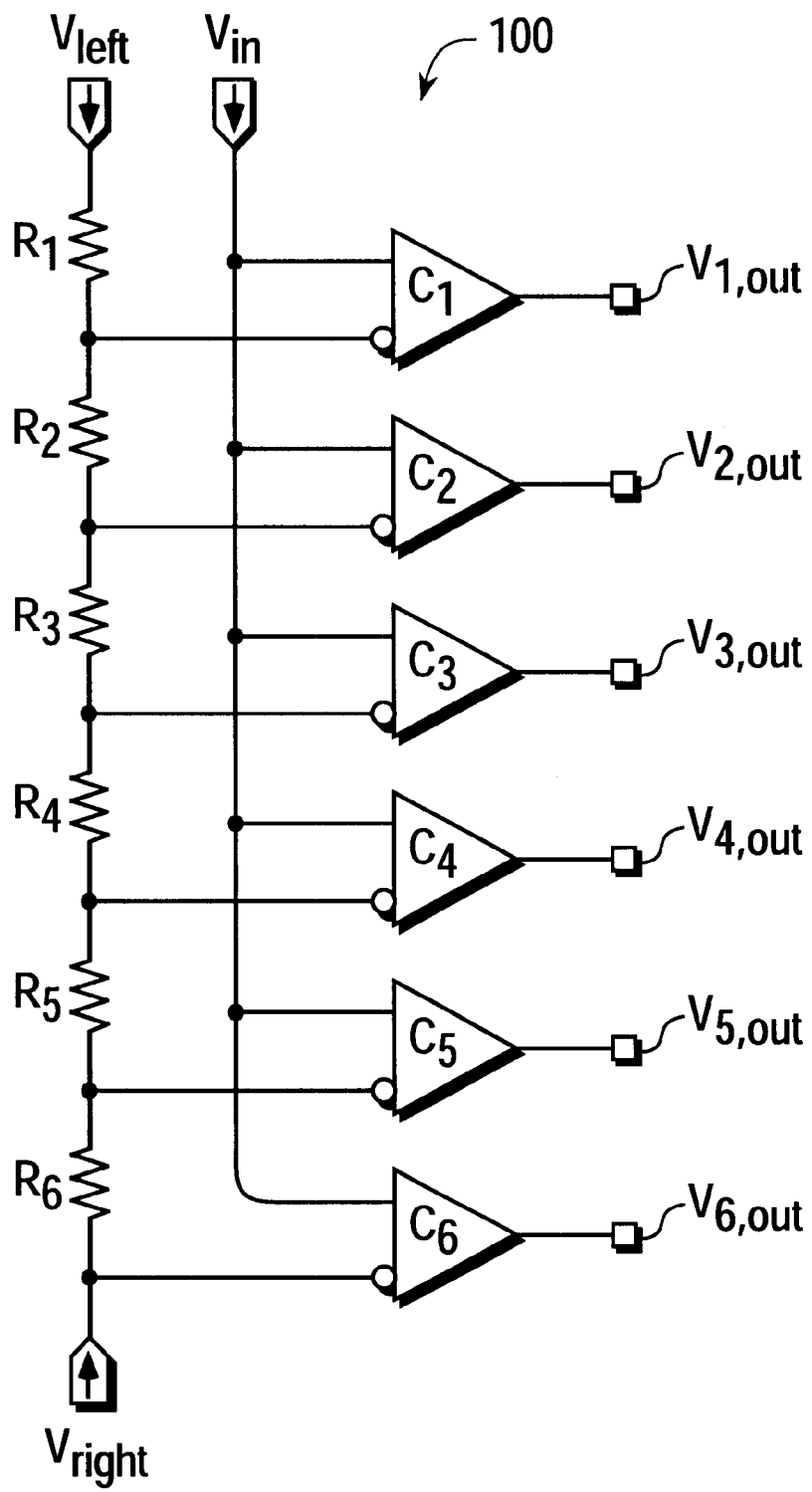
FIG. 1 is a diagrammatic view of a circuit for an analog-to-digital converter having a plurality of comparators each of which compares an input signal against one of a plurality of reference signals defined by an impedance network.

FIG. 1 is a schematic diagram of a circuit that is conventionally used as a flash analog-to-digital converter. The circuit may also be used as a successive approximation converter in accordance with one embodiment of this invention. A successive approximation converter 100 includes a plurality of comparators connected to a corresponding plurality of reference signals at nodes defined by an input impedance network. This is an improvement over a single comparator that is typically used in such a converter because no DAC is required to settle in a feedback path. As illustrated in FIG. 1, an input impedance network in the form of a serially-connected resistor chain includes N resistors $R_1$, $R_2$, $R_3$, ... $R_N$. These resistors have interstitial nodes defined between them that provide reference signals for a plurality of N comparators $C_1$, $C_2$, $C_3$, ... $C_N$. In the example specifically illustrated in FIG. 1, N=6, giving 6 resistors and 6 comparators. However, N may be any integer greater than 1 without deviating firm the invention. Still referring to FIG. 1, the voltage level of the plurality of reference signals is set by signal(s) $V_{left}$, $V_{right}$ applied across the resistor chain. The input voltage $V_{right}$ may represent ground potential, but may represent another voltage level depending on the particular application. Those skilled in the art will appreciate that different voltage levels occurring on either voltage reference may vary without departing from the invention. Each of the comparators $C_1$, $C_2$, $C_3$, ... $C_N$ has a first input connected to a terminal configured to receive the analog input signal $V_{in}$. Each comparator also includes a second input connected to one of the nodes in the impedance network defined by resistors $R_1$, $R_2$, $R_3$, ... $R_N$. The outputs $V_{1,out}$, $V_{2,out}$, $V_{3,out}$, ... $V_{N,out}$ of the respective comparators $C_1$, $C_2$, $C_3$, ... $C_N$ are combined and converted, for example by an encoder or data converter (not shown) into a digital output word having a desired number of bits n. Alternatively, they may be combined and converted into n separate digital signal outputs. The number of comparators, N, would typically be equal to at least $2^n-1$ in conventional systems. According to the invention, however, the finite number of nodes may be used to interpolate digital data bit values between any two nodes. Thus, virtual comparators may be created to produce a larger number of samples of information related to data bits than the number of actual comparators.

According to the invention, still referring to FIG. 1, the converter 100 is operated in a successive approximation manner. In particular, according to one embodiment of the invention, only one comparator of the plurality of comparators $C_1$, $C_2$, $C_3$, ... $C_N$ is enabled at any given time while the remainder are disabled. In this way, the converter 100 operates in a conventional successive approximation manner, where one bit sample is collected for each clock cycle rather than collecting multiple data bits simultaneously.

Each of the plurality of comparators $C_1$, $C_2$, $C_3$, ... $C_N$ outputs a quantity $V_{i,out}=V_i \cdot E_i$, where $1 \leq i \leq N$, and $V_i$ is the difference between the input signal $V_{in}$ and the reference signal applied to comparator $C_i$. In this equation, $E_i$ is the value of an enabling signal. In one embodiment, $E_i=0$ to disable the comparator and $E_i=1$ to enable the comparator. If the outputs $V_{i,out}$ of all of the comparators $C_1$, $C_2$, $C_3$, ... $C_N$ are added together as a group, the total output $V_{out}$ is:

$$V_{out} = \sum_{i=1}^{N} V_{i,out} \qquad (1)$$

The aforementioned selective enabling process causes the value of the enabled comparator outputs to be available at the group output point. Therefore, if the converter 100 selectively enables individual comparators and then sums together the outputs of all the comparators, only the output of the enabled comparators will be represented. Accordingly, the equivalent of a conventional successive approximation converter is created simply by selectively enabling each of the comparators $C_1$, $C_2$, $C_3$, ... $C_N$ in this manner. According to the invention, if the value of E for any one comparator is varied between two integers, 1.5 and 2 for example, a value may be obtained from a portion of a signal that occurs between nodes 1 and 2. Thus, a virtual comparator is created that occurs between nodes 1 and 2.

An analog-to-digital converter 100 according to one embodiment of the invention is operated as follows. First, the comparator is enabled at the half-way point, namely $C_{0.5N}$. Then, if the output $V_{0.5N,out}$ indicates the level of the input signal $V_{in}$ is above the level of the reference signal at this half-way point, the half-way point comparator $C_{0.5N}$ is disabled and the ¾-point comparator $C_{0.75N}$ is then enabled. Conversely, if the output $V_{0.5N,out}$ indicates the level of the input signal is below the level of the reference signal at this half-way point, the half-way point comparator $C_{0.5N}$ is disabled and the ¼-point comparator $C_{0.25N}$ is then enabled. This procedure may be repeated in successive approximation sequence. Establishing virtual comparators is accomplished by interpolating between nodes. They may be created between two adjacent nodes or between any two nodes. In a preferred embodiment, interpolations are performed between adjacent nodes to collect samples of data bits occurring between such nodes. In this way, multiple virtual comparators may be created between any two adjacent nodes of the converter circuit.

According to the invention, the array of N comparators $C_1$, $C_2$, $C_3$, ... $C_N$ is essentially "probed" by the action of setting the $E_i$ enabling signal parameters for one of those comparators to 1 and keeping the others at 0. For example, if $E_5=1$ and $E_i=0$ for all i≠5, the input signal $V_{in}$ is effectively compared with only the reference signal of the $5^{th}$ comparator $C_5$. The process of successive approximation proceeds by setting one of the $E_i$ parameters to 1 and setting the other E parameters to 0. In conventional successive approximation converters, upon exhausting this process, n bits will have been derived and the input now lies between, for example, the $23^{rd}$ comparator $C_{23}$ and the $24^{th}$ comparator $C_{24}$. It would appear that because there is now no comparator at the point half-way between the comparators $C_{23}$ and $C_{24}$, no output can be produced. However, referring again to equation (1), if $E_{23}=0.5$ and $E_{24}=0.5$, then converter 100 provides an output representative of a further comparison relative to a virtual 23½ comparator $C_{23.5}$. Thus, converter 100 is able to linearly interpolate between the actual comparators. For measuring an input voltage signal, if one chooses to use a current that can be divided, for example, into 64 parts, then one can interpolate in $\frac{1}{64}^{th}$ increments from:

$$E_{23}=\frac{63}{64}^{th}, E_{24}=\frac{1}{64}^{th}$$

to $E_{23} = \frac{1}{64}^{th}, E_{24} = \frac{63}{64}^{th}$

By interpolating in this matter, an additional 64 virtual comparators appear to occur between comparators $C_{23}$ and $C_{24}$. Accordingly, 12 bits of information can be derived by converter 100 using only 64 (that is $2^6$) actual comparators. A conventional converter having 64 comparators would be able to derive only 6 bits. Deriving these 12 bits is accomplished according to the invention without any additional hardware elements. The derived interstitial comparators are virtual, and there are no additional comparators or other components. In a Preferred embodiment of the invention, two or more adjacent comparators are each enabled. The outputs of the comparators are then weighted and mixed in proportions calculated to provide an interpolated output of an interstitial virtual comparator. This method, according to the invention, best simulates the input signal $V_{in}$ by providing more samples of information related to the input signal and without the need for additional hardware elements.

Therefore, according to the invention, the outputs of actual comparators are appropriately interpolated in a manner to create the output of a virtual comparator. Furthermore, the virtual comparator, because it does not exist as a discrete hardware element, can be modified in time such that its virtual output signal is time varying. For the actual comparators $C_1, C_2, C_3, \ldots C_N$, the manner in which their outputs are mixed creates virtual comparators at various comparison reference signal levels and in a sequential manner.

One embodiment of the invention provides an analog-to-digital converter able to produce a digital output having more bits than the number of comparators that exist as actual hardware elements to compare signals. For example, where N comparators are employed, n output bits may be produced, where $N<2^n-1$. However, the invention is not limited to a series-connect resistor chain as illustrated in FIG. 1. It will be appreciated by those skilled in the art that the invention is readily adaptable to use with any analog-to-digital converter circuitry having a plurality of comparators. This is also possible whether or not the input signal is differential or non-differential. For example, the invention may be applied to a conventional input impedance network that transforms an analog input voltage signal into a parabolic profile of reference voltage signals.

Figure 2:
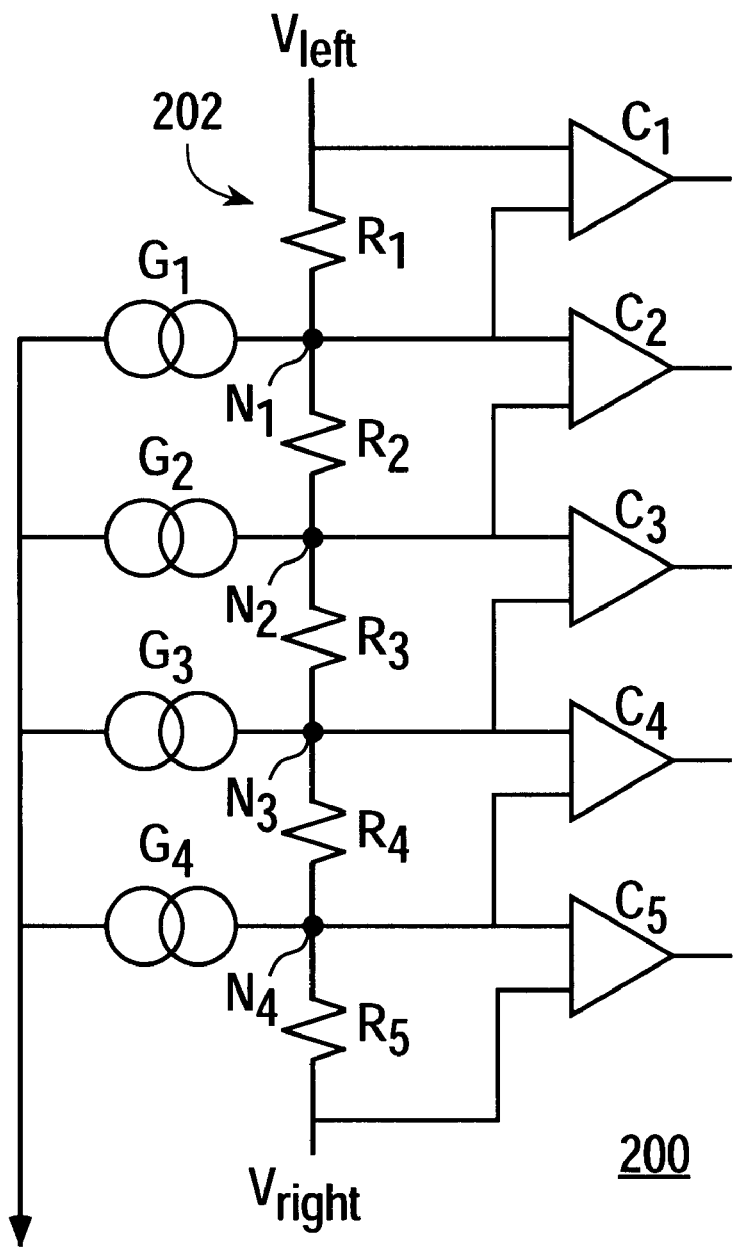
FIG. 2 is a diagrammatic view of a circuit for an analog-to-digital converter having a plurality of comparators each of which compares two points within a parabolic profile of reference signals defined by an impedance network, where the profile of the output shifts as a function of an input signal.

Referring to FIG. 2, an input impedance network and comparator section of a converter 200 is illustrated that is similar to that in FIG. 1. In this case, however, the plurality of comparators $C_1, C_2, C_3, C_4$, and $C_5$, is each placed across a corresponding resistor bank 202 including resistors $R_1, R_2, R_3, R_4$, or $R_5$. This bank of resistors 202 has resistors defining between them nodes $N_1, N_2, N_3$, and $N_4$. From each node, a corresponding current source $G_1, G_2, G_3$, and $G_4$ draws an equal current. The input signal $V_{in}$, expressed as the difference between the signals $V_{left}$ and $V_{right}$, is inherently differential. Also the input impedance network illustrated in FIG. 2 creates a parabolic profile of reference voltage signals. Accordingly, a zero voltage value of the profile of reference signals occurs at different times along the nodes $N_1, N_2, N_3$, and $N_4$ as a function of the input signal $V_{in}$. Implementations of the invention are suitable for any converter having an input impedance network similar to that illustrated in FIG. 2. In such a circuit, a differential input signal $V_{in}$ is applied across the input impedance network and a plurality of comparators $C_1, C_2, C_3, \ldots C_N$ measures differences between nodes $N_1, N_2, N_3, \ldots N_{N-1}$ within that network. In conventional systems, measurements are taken between a node and the input signal $V_{in}$ itself. In fact, the invention is suitable in respect of any reference signal profile and impedance network for an analog-to-digital converter where the converter uses more than one comparator, where each comparator includes an input for an enabling signal.

Figure 3:
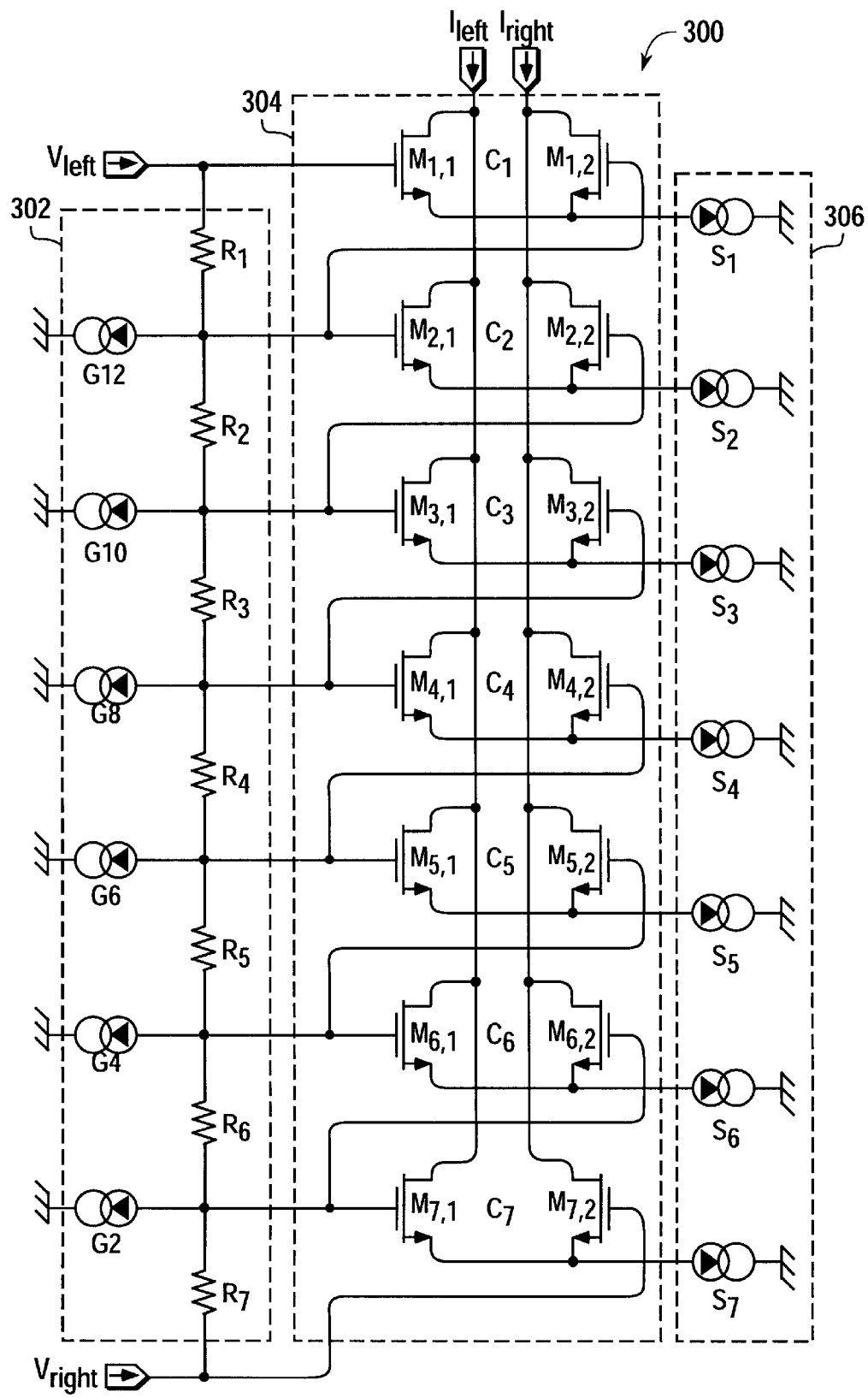
FIG. 3 is a diagrammatic view of a circuit showing a plurality of comparators in an analog-to-digital converter, each comparator having an input for an enabling signal to selectively enable and disable the comparator and to modify its output to generate an interstitial output occurring between two comparators.

FIG. 3 is a schematic diagram of a circuit embodying the invention. Converter circuit 300 is an example of a plurality of comparators 304, $C_1, C_2, C_3, \ldots C_N$ in a converter 300 that can be selectively enabled. The outputs of comparators $C_1, C_2, C_3, \ldots C_N$ can then be compounded together to form the output of the converter 300. Each of the plurality of comparators $C_1, C_2, C_3, \ldots C_N$ consists of a connection of components that has a linear output in proportion to a given input, in particular an input for an enabling signal. The specific components making up the plurality of comparators, 304, $C_1, C_2, C_3, \ldots C_N$ in FIG. 3 is not limiting. It should be apparent to those skilled in the art in light of the following detailed description of the circuit in FIG. 3 that the comparators $C_1, C_2, C_3, \ldots C_N$ may be configured differently according to the invention so long as they display a similarly linear input-output characteristic. Once the invention embodied in the converter 300 of FIG. 3 is understood, those principles can be applied to any analog-to-digital converter having a plurality of comparators that are selectively enabled or disabled to varying degrees to produce virtual comparators. According to the invention, these virtual comparators are configured to produce interpolated voltage values that occur between adjacent nodes.

In the example illustrated in FIG. 3, a converter 300 includes a bank 304 of N comparators $C_i$. Each comparator includes a pair of three-terminal semiconductor devices $M_{i,1}$ and $M_{i,2}$, $1 \leq i \leq N$. In a preferred embodiment, the low-impedance connection of the two devices are connected in common to one of a bank 306 current sources, $S_i$, 306. The bank of current sources 306 provides enabling signals for the individual comparators $C_i$. The three-terminal devices $M_{i,1}$ and $M_{i,2}$ can be, for example, field-effect transistor ("FET") or bipolar junction transistor ("BJT") devices. In any such specific configuration, the comparator $C_i$ will be responsive to the voltage difference at the gates or bases of the pair of devices, depending on how the device is configured. Where each of $M_{i,1}$ and $M_{i,2}$ consists of an n-channel-type metal-oxide-semiconductor FET ("NMOS") device as illustrated in FIG. 3, the sources of those devices would be connected together to a current source $S_i$. In operation, the current from current source $S_i$ would be split between the two devices $M_{i,1}$ and $M_{i,2}$ depending on the relative gate voltage of devices $M_{i,1 \ and \ Mi,2}$. Each pair of devices $M_{i,1 \ and \ Mi,2}$ together form a comparator $C_i$ responsive to the voltage difference applied between the gates of the pair of devices $M_{i,1}$ and $M_{i,2}$. The voltage difference is in turn provided by an input impedance network. The drains of all devices $M_{i,1}$ are connected together to provide an output current $I_{left}$, and the drains of all devices $M_{i,2}$ are connected together to provide an output current $I_{right}$. The output of converter 300 can be considered the difference between the output currents $I_{left}$ and $I_{right}$, which are at nodes comprising sufficiently low impedance points to hold the appropriate voltage bias conditions.

In this example, each of the comparators $C_1, C_2, C_3, \ldots C_N$ is placed across a corresponding resistor $R_1, R_2, R_3, \ldots R_N$, each having a value R. These resistors are connected in series and define between them nodes from each of which a corresponding current source $G_1, G_2, G_3, \ldots G_N$ draws an equal current having a value $I_s$. Drawing from a bank of current sources and corresponding resistors 302 creates a parabolic profile of reference voltage signals having a zero voltage value that occurs as a function of the input signal $V_{in}$. The input voltage $V_{in}$ is the difference between the signals $V_{left}$ and $V_{right}$. The comparator at the vertex of the parabolic profile will vary as the input signal $V_{in}$ is varied. In this way, the comparators $C_1$, $C_2$, $C_3$, ... $C_N$ are responsive to the input signal $V_{in}$. Even though FIG. 3 shows the comparators connected to an input impedance network 302 configured to produce parabolic profile of reference voltage signals the comparators $C_1$, $C_2$, $C_3$, ... $C_N$ can easily also be connected to an input impedance network in the same manner other input impedance networks known in the art, without deviating from the principles of this invention.

Referring again to the circuit in FIG. 3, in operation, each of the current sources $S_i$ is able to provide an enabling signal in the form of a "probe" current that selectively enables the pair of devices $M_{i,1}$ and $M_{i,2}$ that make up comparator $C_i$. For example, if only current source $S_6$ is active and set to 10.0 μA, and all other current sources $S_i$, i≠6, set to 0 μA, then the difference in the output currents $I_{left}$ and $I_{right}$ will be simply the divisional function of current that is present in the outputs of the comparator $C_6$, where the outputs emanate from the drains of devices $M_{6,1}$ and $M_{6,2}$ respectively.

Figure 4:
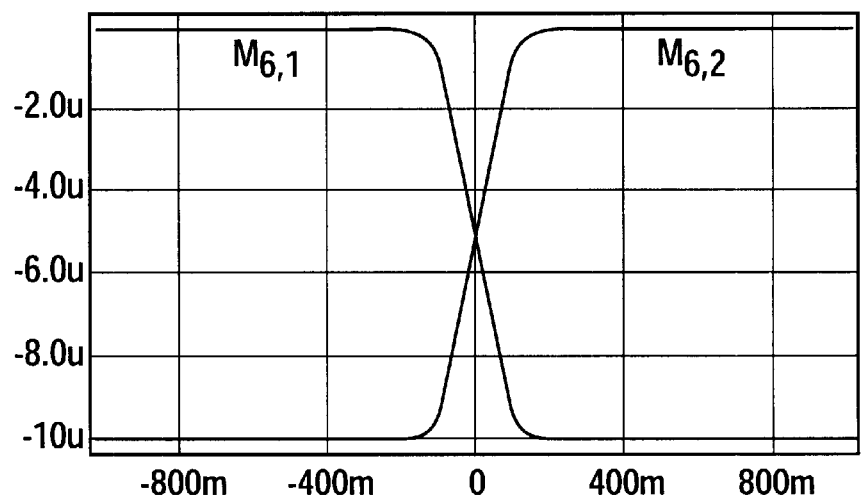
FIG. 4 is a graph showing the output signals of a comparator versus the input signals.

FIG. 4 is a graph showing on its vertical axis the currents present at the drains of devices $M_{6,1}$ and $M_{6,2}$ in response to a 10.0 μA current from current source $S_6$ versus a range of input voltage differences between the gates of devices $M_{6,1}$ and $M_{6,2}$ which are shown on the horizontal axis. It can be seen that, when viewed over the entire range of possible input voltage differences, the output current in the drain of the devices $M_{6,1}$ and $M_{6,2}$ is not linear—from one extreme of all the current from current source $S_6$ flowing to the drain of device $M_{6,1}$ to all of the current flowing to the drain of $M_{6,2}$; however, in the circuitry making up converter 300 (FIG. 3), this pairing of devices $M_{6,1}$ and $M_{6,2}$ operates only near the "center" of the transfer characteristic where the current splits approximately equally between the devices $M_{6,1}$ and $M_{6,2}$. This occurs where slight deviations from the "center" are linear, recognizing that there is a limited range of voltage differences that can be applied to the gates of the devices $M_{6,1}$ and $M_{6,2}$ before one or the other of those devices saturates. The drains of all devices $M_{i,1}$ are compounded together to provide output current $I_{left}$ and the drains of all devices $M_{i,2}$ are compounded together to provide output current $I_{right}$, $1 \leq i \leq N$. This compounding increases the region of linearity in the overall transfer characteristic.

Figure 5:
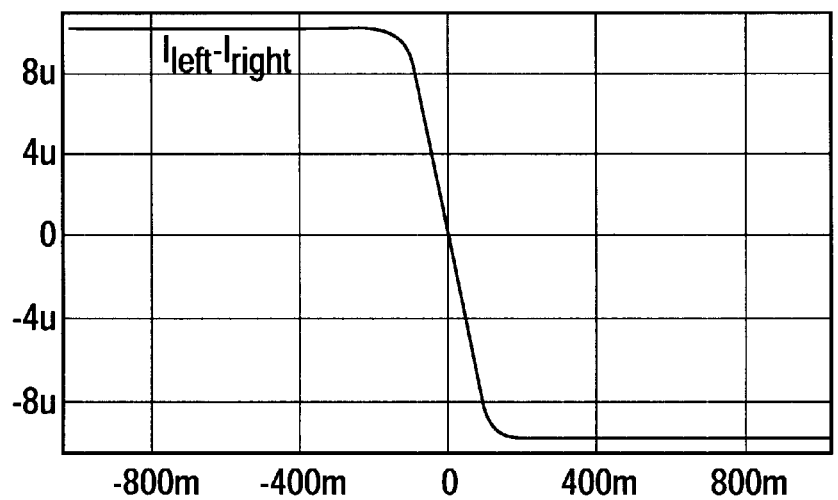
FIG. 5 is a graph showing the overall differential output of a converter when it is enabled versus the difference in its input signals.

In the present example, since the output of the converter 300 can be considered the difference between the total output currents $I_{left}$ and $I_{right}$, and since only current source $S_6$ is providing a non-zero current resulting in only the comparator $C_6$ being enabled, it is clear that the output of the converter 300 is the difference of the two output currents from the comparator $C_6$. These are the outputs present at the drains of devices $M_{6,1}$ and $M_{6,2}$, as shown in the graph in FIG. 4. In this regard, FIG. 5 is a graph showing the total output of the converter 300 as being the difference in the output currents from the only enabled comparator $C_6$.

When the voltage difference between the gates of devices $M_{6,1}$ and $M_{6,2}$ is zero, the output of converter 300 is also zero. A circuit responsive to the difference in output currents of converter 300 would therefore have a zero input only when the voltage at the gate of device $M_{6,1}$ is the same as the voltage at the gate of device $M_{6,2}$. Referring again to FIG. 3, it can be seen that this condition is present only when the voltage difference across resistor $R_6$ is zero. This is possible when the difference between signals $V_{left}$ and $V_{right}$ causes zero current to flow through resistor $R_6$. Using $V_{R6}$ to represent the voltage that is present at the nodes on either end of $R_6$, it can be seen from basic circuit analysis of FIG. 3 that:

$$V_{right}=V_{R6}+R \cdot I_s \quad (2)$$

where R is the value of each of the resistors $R_1$, $R_2$, $R_3$, ... $R_N$ and $I_s$ is the value of the equal current flowing through each of the current sources $G_1$, $G_2$, $G_3$, ... $G_N$. Again using basic circuit analysis and making use of superposition of linear equations, it can be seen that signal $V_{left}$ must be equal to:

$$V_{left}=V_{R6}+5R \cdot I_s+4R \cdot I_s+3R \cdot I_s+2R \cdot I_s+R \cdot I_s$$

and therefore:

$$V_{left}=V_{R6}+15R \cdot I_s \quad (3)$$

Accordingly, if $V_{in}=V_{left}-V_{right}$, the value of input signal $V_{in}$, in order for the only enabled comparator $C_6$ to produce a zero output, must be equal to the following:

$$V_{in}=14R \cdot I_s \quad (4)$$

Therefore, in situations where only current source $S_6$ provides a non-zero current, only the comparator $C_6$ is enabled. $C_6$ compares the input signal $V_{in}$ to a reference voltage signal having a value of $14R \cdot I_s$.

A similar analysis will show that if only current source $S_5$ provides a non-zero current, only the comparator $C_5$ will be enabled. And the voltage difference across resistor $R_5$ must be zero for the comparator $C_5$ to produce a zero output. It follows that:

$$V_{right}=V_{R5}+2R \cdot I_s R \cdot I_s$$

and therefore:

$$V_{right}=V_{R5}+3R \cdot I_s \quad (5)$$

It also follows that:

$$V_{left}=V_{R5}+4R \cdot I_s+3R \cdot I_s+2R \cdot I_s+R \cdot I_s$$

and therefore:

$$V_{left}=V_{R5}10R \cdot I_s \quad (6)$$

Given that $V_{in}=V_{left}-V_{right}$, the value of the input signal $V_{in}$, in order for the only enabled comparator $C_5$ to produce a zero output, must be equal to:

$$V_{in}=7R \cdot I_s \quad (7)$$

Therefore, in situations where only current source $S_5$ provides a non-zero current, only the comparator $C_5$ is enabled. Comparator $C_5$ compares the input signal $V_{in}$ to a reference voltage signal having a value of $7R \cdot I_s$.

Figure 6:
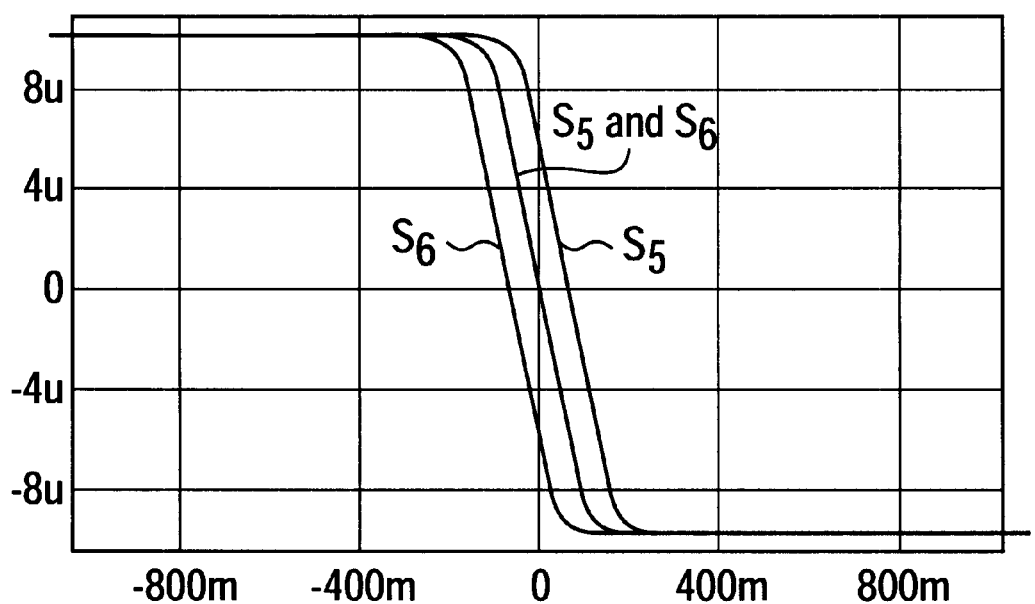
FIG. 6 is a graph showing the overall output of converter when two comparators are enabled versus the difference in input signals to those comparators.

The virtual comparators of the invention are based on the following observation: if both current source $S_6$ and current source $S_5$ are set to provide non-zero currents at the same time, then both the comparators $C_6$ and $C_5$ are enabled at the same time. The overall effective comparison point for the converter 300 will then fall between $14R \cdot I_s$ and $7R \cdot I_s$. If the two non-zero currents provided by current source $S_6$ and current source $S_5$, added together, are equivalent in value to the single non-zero current provided by the single non-zero current source $S_6$ or $S_5$, then the output of the converter 300 will be the difference in the output currents $I_{left}$ and $I_{right}$, illustrated in FIG. 6.

The combined effect of allowing currents from both current source $S_6$ and current source $S_5$ to flow is that the output of the converter 300 is zero only when the difference in the output currents from the comparator $C_6$ is equal and opposite to the difference in the output currents from the comparator $C_5$. Within a narrow region, the outputs of a comparator $C_5$ or $C_6$ are linearly related to the inputs thereto. For this reason, in order for the output of the converter 300 to be zero, it is also necessary for the difference between the input signal $V_{in}$ and the voltage reference signal to which comparator $C_5$ compares the input signal $V_{in}$ to be equal and opposite to the difference between the input signal $V_{in}$ and the voltage reference signal to which comparator $C_5$ compares the input signal $V_{in}$. Applying equations (4) and (7) to this principle, when both current sources $S_5$ and $S_6$ provide equal non-zero currents (for example, each providing $5.0 \mu A$ of the original $10.0 \mu A$ single probe current), the following must be true:

$$V_{in} - 14 R \cdot I_s = 7 R \cdot I_s - V_{in} \quad (8)$$

and therefore:

$$V_{in} = 10.5 R \cdot I_s \quad (9)$$

which is halfway between the respective voltage reference signal levels of the two comparators $C_5$ and $C_6$. Thus activating current sources $S_5$ and $S_6$ to provide enabling signals to enable comparators $C_5$ and $C_6$ at the same time has resulted in the converter 300 comparing the input signal $V_{in}$ to a voltage reference signal level between those against which the comparators $C_5$ and $C_6$ would normally compare the input signal $V_{in}$ were either of them enabled alone.

Based on the linearity of the transfer characteristic within the normal operation of the comparators $C_1, C_2, C_3, \ldots C_N$, further analysis shows that if the currents provided by current sources $S_5$ and $S_6$ are both non-zero but not equal, further interstitial reference signal levels result as a function of the ratio between the unequal non-zero currents. For example, if the current provided by current source $S_6$ is 7.5 $\mu A$ and the current provided by current source $S_5$ is only 2.5 $\mu A$, a 3:1 ratio, then the voltage difference between the input signal $V_{in}$ and the reference signal level of the comparator $C_6$ (which would normally need to be equal and opposite to the difference between the input signal $V_{in}$ and the reference signal level of the comparator $C_5$ for the converter 300 to produce a zero output overall) would now need only to be one-third of the difference between the input signal $V_{in}$ and the reference signal level of the comparator $C_5$ and the following will be true:

$$3 \cdot (V_{in} - 14 R \cdot I_s) = 7 R \cdot I_s - V_{in} \quad (10)$$

and therefore:

$$V_{in} = 12.25 R \cdot I_s \quad (11)$$

which makes up three-quarters of the difference between the reference signal level of the comparator $C_5$ and the reference signal level of the comparator $C_6$.

It can be seen from these examples that the circuit is operating proportionately and that any virtual comparison point may be selected between the respective comparison points of comparators $C_1, C_2, C_3, \ldots C_N$, whichever of them should be enabled at any given time, simply by weighting the current proportionately through the corresponding current sources $S_1, S_2, S_3, \ldots S_N$.

As will be apparent to those skilled in the art in the light of the foregoing disclosure, many alterations and modifications are possible in the practice of this invention without departing from the spirit or scope thereof.

In one embodiment, only one or two comparators may be enabled at a time. It is conceivable that more than two comparators may be advantageously employed to further reduce the error of using only a pair. For example, in the circuit in FIG. 3, the current sources can be manipulated such that current source $S_3$ provides $1.0 \mu A$, current source $S_4$ provides $4.0 \mu A$, current source $S_5$ provides $4.0 \mu A$, and current source $S_6$ provides $1.0 \mu A$ (of the original $10.0 \mu A$) so as to enable comparators $C_3, C_4, C_5$, and $C_6$ in a desired manner. The inclusion of four appropriately weighted enabled comparators causes a partial "mean of means" reduction of DC offset.

In other embodiments, the invention is applicable regardless of how the plurality of comparators is arranged within the circuitry for the converter. The invention is readily applied to add virtual comparators to any grouping of comparators within a circuit. Such a configuration allows for the simulation of additional comparators to provide interstitial outputs. This improves the resolution of the converter without requiring additional hardware elements for making further comparisons.

In other embodiments, the invention may be even used in association with a converter circuit partially operated as a flash analog-to-digital converter and partially operated as a successive approximation converter. For example, it may be used after a flash analog-to-digital converter, having the properties described above, has simultaneously collected one bit of information per comparator and produced a digital word of a given number of bits. The same converter can then be adapted to proceed in a successive approximation mode according to the invention to produce a digital word of a greater number of bits and resolution. Using the same circuitry as the flash analog-to-digital converter, but in accordance with the preferred successive approximation method described above, the two comparators that are closest to the initial digital output produced by the flash method are then selectively enabled. Their outputs may then be interpolated, weighted and mixed in appropriate proportions, to produce virtual comparators as described above. By applying this method successively, a greater number of bits and resolution will be achieved by the converter without modifying the converter circuitry or adding further hardware elements.

The invention has been described with reference to a comparator circuit configured to produce outputs of greater resolution, better linearity and better accuracy. This is accomplished by producing outputs from virtual comparators derived between nodes of actual comparators by interpolating output values. It will be appreciated by those skilled in the art that the invention has broader utility. Other embodiments may be implemented according to the invention without departing from the spirit and scope of the invention. The scope of the invention is to be construed in accordance with the substance defined by the following claims.

What is claimed is:

1. An analog-to-digital converter comprising:
   a converter input for receiving an analog input signal to be converted;
   an input impedance network for creating a plurality of reference signals;
   a plurality of comparators corresponding to said plurality of reference signals, each of said comparators having a first comparator input connected to said input impedance network to provide said comparator with one of said plurality of reference signals, a second comparator input connected to said converter input for receiving said analog input signal, a third comparator input connected to its own enabling signal source for receiving an enabling signal, and a comparator output that outputs a signal only when signals are received at the same time at the first, second, and third comparator inputs, wherein the first comparator input and second comparator input of each of said plurality of comparators control the transfer of an enabling signal at the third comparator input to a signal at the comparator output, and wherein the transfer characteristic of each comparator between the third comparator input to the comparator output is linear, wherein each of said plurality of comparators comprises a first and a second three-terminal semiconductor device, said first semiconductor device having its base or gate connected to said first comparator input and said second semiconductor device having its base or gate connected to said second comparator input, and the low impedance connection of said first and second semiconductor devices connected in common to said third comparator input; and a converter output connected to a comparator output of each of said plurality of comparators.

2. An analog-to-digital converter as claimed in claim 1 wherein each of said first and second semiconductor devices is a field-effect transistor device.

3. An analog-to-digital converter as claimed in claim 1 wherein each of said first and second semiconductor devices is a bipolar junction transistor device.

4. An analog-to-digital converter comprising:

a converter input for receiving an analog input signal to be converted;

an input impedance network connected to said converter input for creating a plurality of reference signals having a parabolic profile, said profile having a zero which varies as a function of said analog input signal;

a plurality of comparators corresponding to said plurality of reference signals, each of said comparators having a first comparator input connected to said input impedance network to provide said comparator with one of said plurality of reference signals, a second comparator input connected to said input impedence network to provide said comparator with a different one of said plurality of reference signals, a third comparator input connected to its own enabling signal source for receiving an enabling signal, and a comparator output that outputs a signal only when signals are received at the same time at the first, second, and third comparator inputs, wherein the first comparator input and second comparator input of each of said plurality of comparators control the transfer of an enabling signal at the third comparator input to a signal at the comparator output, and wherein the transfer characteristic of each comparator between the third comparator input to the comparator output is linear, wherein each of said plurality of comparators comprises a first and a second three-terminal semiconductor device, said first semiconductor device having its base or gate connected to said first comparator input and said second semiconductor device having its base or gate connected to said second comparator input, and the low impedance connection of said first and second semiconductor devices connected in common to said third comparator input; and a converter output connected to a comparator output of each of said plurality of comparators.

5. An analog-to-digital converter as claimed in claim 4 wherein each of said first and second semiconductor devices is a field-effect transistor device.

6. An analog-to-digital converter as claimed in claim 4 wherein each of said first and second semiconductor devices is a bipolar junction transistor device.

* * * * *